Oct. 12, 1971 P. A. DOSIER 3,611,561

TRANSFER MECHANISM WITH LOADING NEST

Filed April 21, 1969 5 Sheets-Sheet 1

INVENTOR.
PAUL A. DOSIER

BY
FOWLER, KNOBBE
& MARTENS
ATTORNEYS.

INVENTOR.
PAUL A. DOSIER
BY
FOWLER, KNOBBE
& MARTENS
ATTORNEYS.

INVENTOR.
PAUL A. DOSIER
BY
FOWLER, KNOBBE
& MARTENS
ATTORNEYS.

TRANSFER MECHANISM WITH LOADING NEST

Filed April 21, 1969 5 Sheets-Sheet 4

INVENTOR.
PAUL A. DOSIER
BY
FOWLER, KNOBBE & MARTENS
ATTORNEYS.

INVENTOR.
PAUL A. DOSIER
BY
FOWLER, KNOBBE & MARTENS
ATTORNEYS.

United States Patent Office 3,611,561

Patented Oct. 12, 1971

3,611,561

TRANSFER MECHANISM WITH LOADING NEST

Paul A. Dosier, Costa Mesa, Calif.
(2302 Fairhill Drive, Newport Beach, Calif. 92660)

Filed Apr. 21, 1969, Ser. No. 817,998
Int. Cl. H05k *3/30, 13/04*
U.S. Cl. 29—626 26 Claims

ABSTRACT OF THE DISCLOSURE

A transfer apparatus for accurately positioning a plurality of electronic elements on a substrate, having a base for mounting both the substrate and a loading tray from which the electronic elements are to be moved. The substrate and loading tray are moved in tandem to a predetermined location wherein a transfer mechanism may transfer an electronic element from the loading tray to the substrate by moving between two predetermined positions.

This invention is directed to a transfer device for accurately positioning and fastening electronic circuit elements on appropriate substrates.

During the assembly of small electronic circuit elements such as pre-doped semiconductive dice or chips on to integrated circuit substrates for formation of larger complex electronic circuits, it is necessary to accurately position a plurality of circuit elements in specific orientations at various locations on the surface of the substrate. Since many of these circuit elements are both fragile and extremely small, numerous methods have been devised for delicately carrying out this operation, and for attaching the circuit elements to the substrate.

This operation is commonly accomplished by accurately positioning each individual circuit element in a single position transfer tray and, subsequently, through the use of a pickup device and transfer arm, moving the circuit element to a second location above the substrate on which the circuit element is to be mounted. The substrate, in such an apparatus, must be very accurately positioned relative to the loading tray so that circuit elements may be placed at the precise substrate location desired. Use of this system requires the operator, who must be a skilled craftsman, to load one circuit element into the positioning tray at a time and then, by picking the circuit element up and moving the transfer arm of the substrate, to transfer each circuit element to the precise position on the substrate where it belongs. Generally, this is accomplished by translating either the transfer arm or the substrate linearly along a single fixed axis. This operation must be repeated for each chip. Thus the transfer tray must be individually loaded with a semiconductive chip in precise alignment for every translation and the substrate placement must be accurately aligned to receive a new chip. Since the semiconductive chips and substrates are so small that microscopes must be used to check their orientation and properly align them, the operation consumes a good deal of skilled operator time. If the operator misaligns the substrate or the chip in the transfer tray the circuit element is placed incorrectly and will not function, since both the substrates and chips are pre-doped at certain portions or carry vacuum deposited contact strips which must make contact with specific portions of the other member. Consequently, there is a great need for a device which can be operated by unskilled personnel for translating semiconductive chips on to pretreated substrates in a regular manner. Such a device should not require microscopic alignment of chips between each translation of a chip to the substrate since this is both time consuming and highly susceptible to error.

The present invention includes a transfer device which has a selectively energizable member which moves between a first and second position for rapidly and accurately transferring circuit elements from a point adjacent said first position to a point on a substrate adjacent said second position without the need for microscopic alignment of the chip on the substrate, or for microscopically orienting individual chips in a transfer tray or other member intermediate each chip translation to the substrate. This is accomplished by a translation device capable of X–Y movement, i.e., movement along two fixed axes which are perpendicular to each other in combination with a transfer arm capable of linear movement between two fixed positions in association with the translation device. A pair of platforms are mounted in tandem in fixed relationship with each other for co-movement on the translation device. Thus, a preloaded multiple-nest transfer tray can be used on one of the platforms with the appropriate substrate on the other.

Unskilled operators can be utilized for preloading the trays and the preloaded trays can be stockpiled so that an additional saving of time and expenditure is realized. The translation device operator simply replaces a complete tray of circuit elements to be transferred, and a complete substrate, and thereafter rapidly transfer all of the circuit elements to their proper locations on the substrate. Since the substrate and the preloaded tray of circuit elements are accurately aligned with respect to each other, the requirement for operator accuracy in alignment of the transfer arm with these members is greatly reduced. The element will be placed in the proper location even if the substrate and loading tray are not exactly aligned with the transfer mechanism, so long as the pickup device on the transfer arm picks up the circuit element. On prior devices the pickup device was required to contact the circuit element in a very precise location.

The basic structure of the present invention includes a first platform for holding a chip positioning member or multiple-nest loading tray, which holds a plurality of circuit elements to be transferred. A second platform is in fixed relationship with the first platform for accurately holding the substrate in a fixed position relative to the loading tray. A transfer arm is mounted in working relationship with the first and second platforms for movement between two fixed positions, one adjacent the loading tray, the other adjacent the substrate. The two platforms are accurately aligned with one another and are moved along fixed perpendicular axes in tandem, such that one fixed position of the transfer arm is located above one of the preoriented circuit elements in the loading tray. The transfer mechanism is adapted to raise the circuit element from the loading tray, move to its second fixed position adjacent a location on the substrate and place the circuit element on the substrate. The relative positions of the various circuit elements on the substrate, after complete transfer, are therefore identical to their previous relative positions on the transfer tray. Even if the operator makes an error in aligning the platforms with the transfer mechanism, accuracy of placement is maintained, since the chip which is picked up by an off-center transfer mechanism is placed in a similar off-center manner on the substrate. Thus, since the substrate and loading tray are accurately inter-aligned, such operator error cancels itself.

It is also possible with the device of this invention to mount a bonding mechanism in fixed space relationship with the transfer arm so that when the transfer arm is above a particular circuit element on the loading tray the bonding mechanism is above the position on the substrate to which the transfer arm will carry the circuit element. The bonding mechanism may be adapted to apply an adhesive to the substrate at that particular location at the same time that the pickup device of the transfer arm picks up the circuit element from the positioning member. Any misalignment of the platforms with the transfer device will cause the adhesive to be applied off-center, but adhesive position is not critical. The apparatus therefore allows the operator to transfer the individual circuit members from a plurality of locations on the positioning member to a comparable plurality of positions on the substrate and, simultaneously, apply attaching adhesive to the substrate. Both the transfer mechanism and adhesive applicator may be advantageously designed such that the pressure applied to the circuit elements and the substrate by these members is limited to avoid damage to the fragile components.

The transfer arm may also be designed such that, on placement of the circuit element on the substrate, the circuit element is simultaneously bonded to the substrate, as by ultrasonic bonding means, thermal-compression means, or soldering means attached to the transfer arm. With this general description of the apparatus and method involved, the present invention can be best understood through a discussion of the appended drawings wherein.

Figures 6, 7:
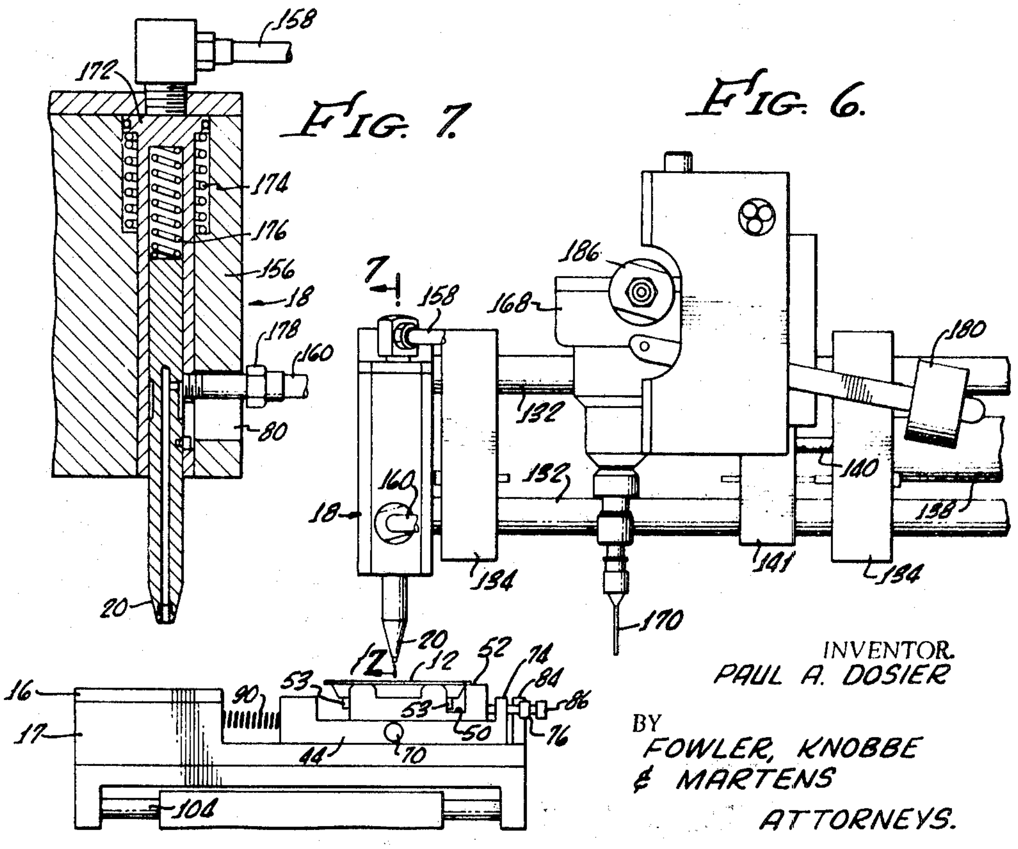
FIG. 6 is a side elevational view of the transfer mechanism of FIG. 5 showing the transfer arm positioned over the substrate.
Figure 8:
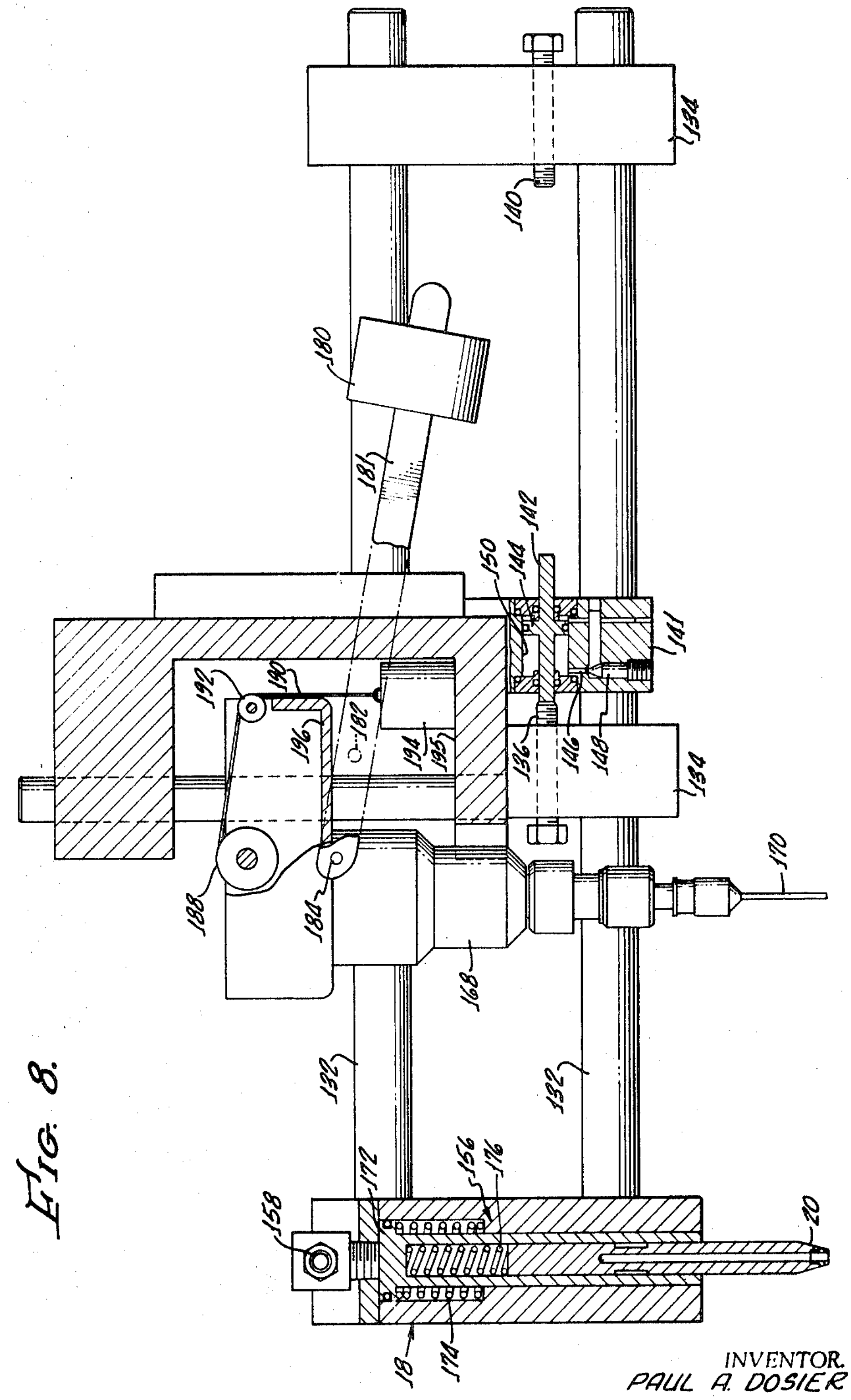

FIG. 7 is a vertical section taken substantially along line 7—7 of FIG. 6 showing the transfer arm and its associated pickup needle; and FIG. 8 is an enlarged side elevational view of a transfer mechanism constructed in accordance with this invention, partially sectioned to show the pressure limiting mechanism of the adhesive applicator and the shock absorbing means associated with the transfer arm reciprocating means.

Figure 1:
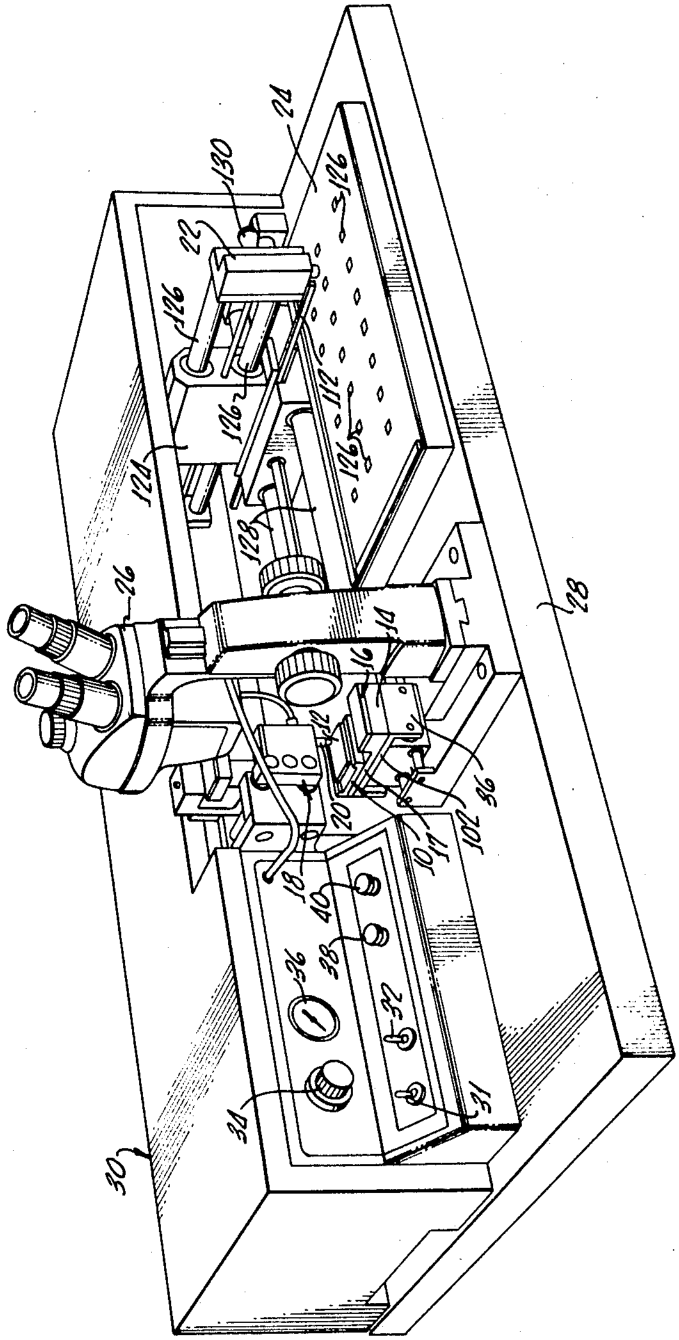
FIG. 1 is a perspective view of the front, top and right side of a transfer device constructed in accordance with this invention.

Referring to FIG. 1, the major components of the workpiece mounting members of the transfer apparatus of the present invention are the circuit substrate mounting platform assembly 10 which accurately positions a substrate 12 thereon and a circuit element mounting platform 14 which supports a circuit element loading tray 16. The platform assembly 10 is mounted on a base plate 17 which is integrally connected to the platform 14.

A transfer mechanism 18 is located generally above the platform 10 and 14 and carries a vertically reciprocative, selectively energizable vacuum pickup needle 20. The platforms 10 and 14 are manually aligned in tandem under the transfer mechanism 18 through an appropriate linkage and reducing gear trains by an indexing arm 22 which is positionable over an indexing template 24 which is much larger than the substrate 12 or the loading tray 16. A microscope 26 may be slideably mounted in a dovetail slot as an aid to check the alignment of the vacuum needle 20 over the platforms 10 and 14 and to assure a proper placement of circuit elements upon the substrate 12.

The entire device is mounted on a portable table or base 28 and most of the controls are included within a cabinet 30. A main power switch 31, a template vacuum holding switch 32, a pressure control knob 34, a pressure gage 36 and operation start and complete buttons 38 and 40 respectively are all the controls needed for simple operation of the device.

Figure 2:
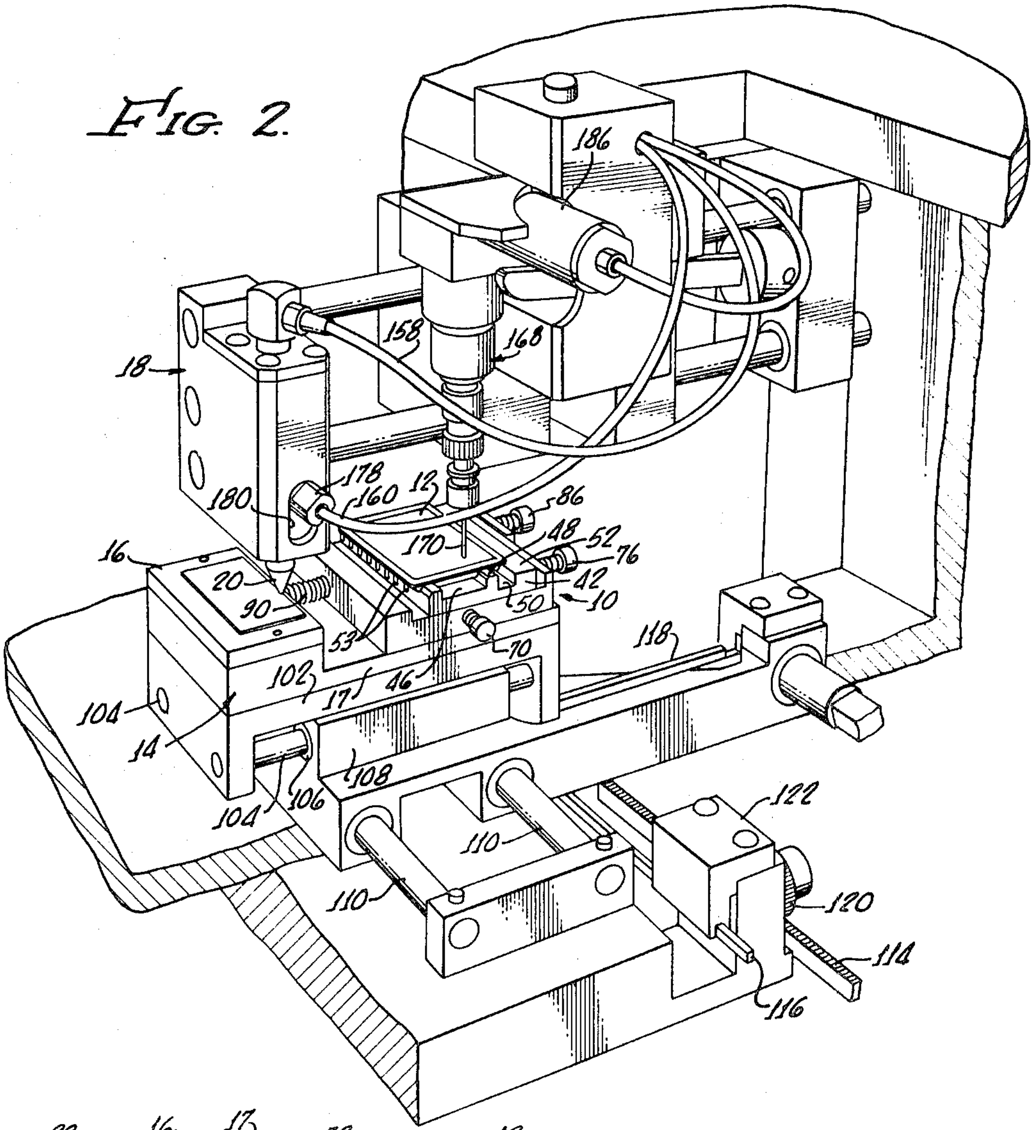
FIG. 2 is a perspective view of the front, top and left side of the transfer mechanism of the device shown in FIG. 1.
Figure 3:
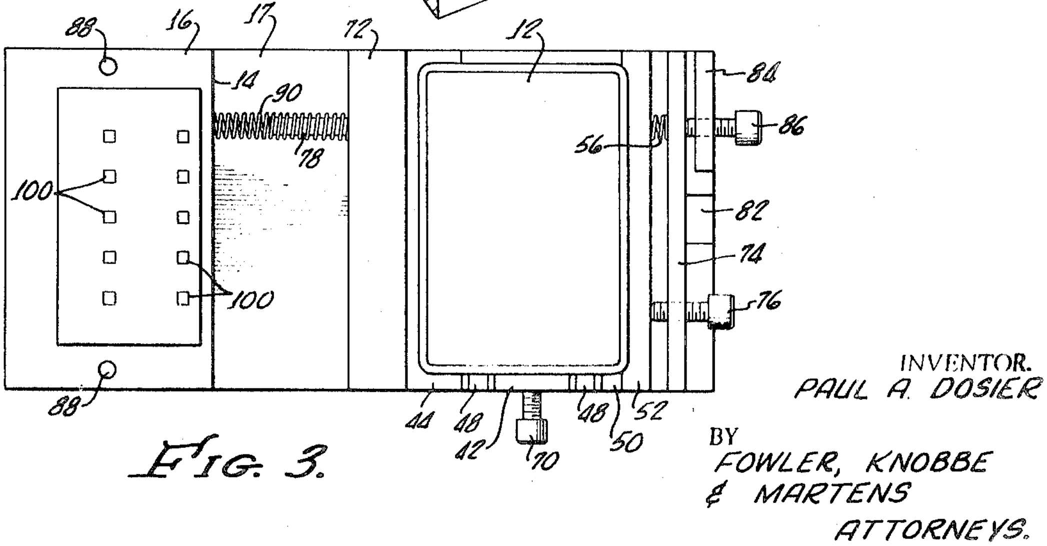
FIG. 3 is a top plan view of the positioning member and substrate mounted on their respective receptacles of the device shown in FIG. 1.
Figure 4:
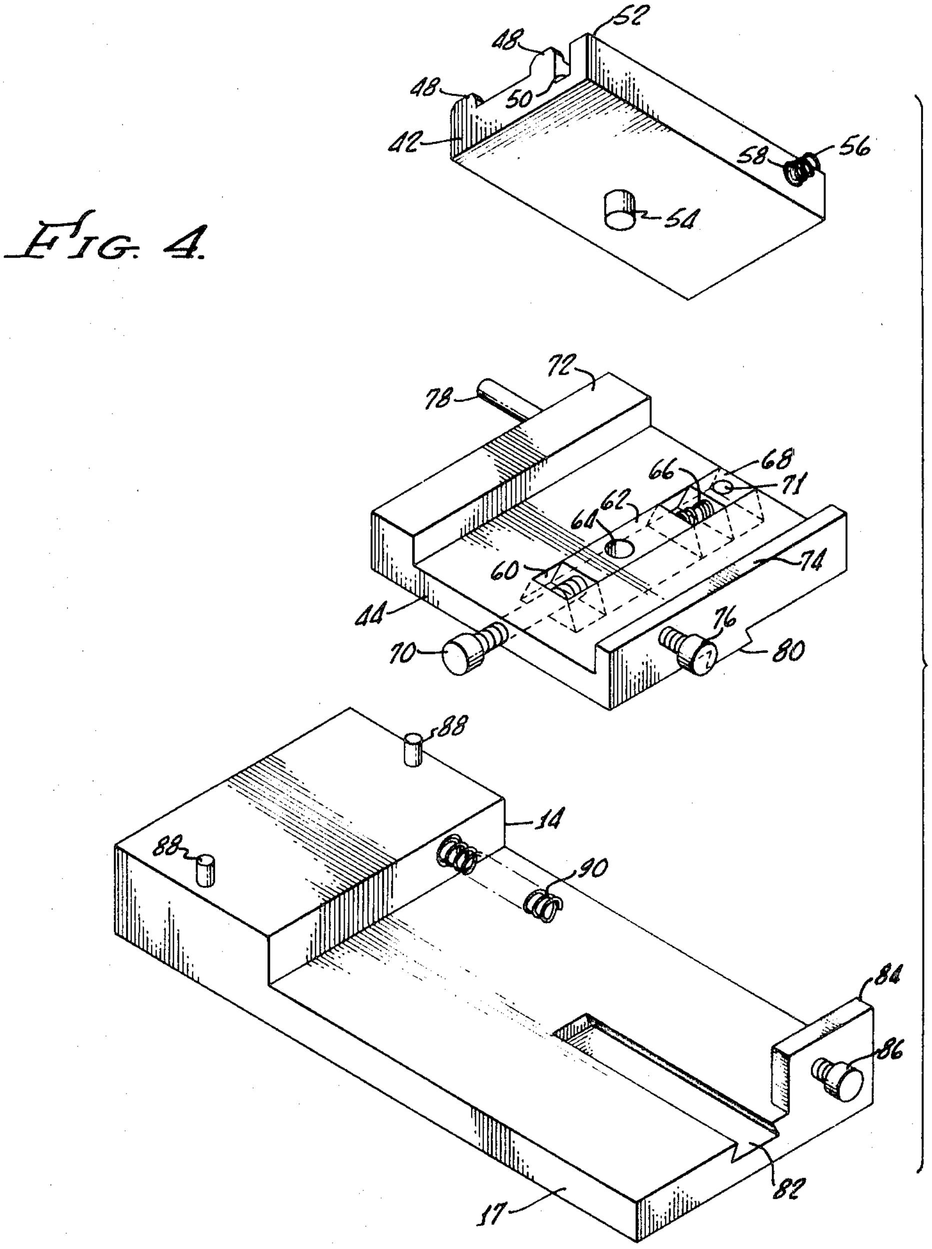
FIG. 4 is an exploded view of the mounting platform assembly of FIGS. 1 through 3.
Figure 5:
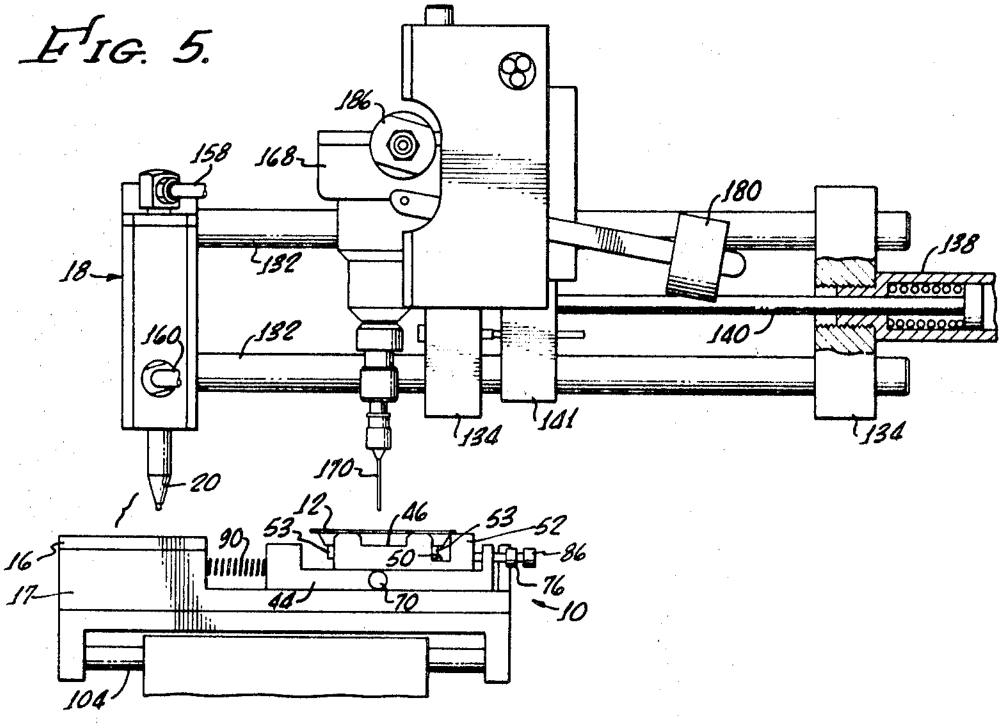
FIG. 5 is a side elevational view, partially in section, of a transfer mechanism constructed in accordance with this invention showing the transfer arm positioned over the positioning member and showing the reciprocating means.

As shown in FIGS. 2, 3 and 4, the platform assembly 10 consists of a substrate holder 42 and a support 44 which carries the substrate holder. As best shown in FIGS. 2, 3 and 5, the substrate holder 42 has a flat substrate receiving surface 46 which is generally rectangular in configuration and bounded at the ends of each of the longer sides by substrate positioning posts 48. An elongate channel 50 is interposed between the substrate receiving surface 46 and an upstanding longitudinally extending end abutment wall member 52 on the substrate holder 42. As best shown in FIG. 5, the bottom of the substrate 12 rests flat on the substrate receiving surface 46 and is prevented from longitudinally sliding by the positioning posts 48 and from transverse sliding by the sides of the channel 50 and the forward side of the substrate support which engage the depending terminal pins 53 which extend longitudinally along the each edge of the substrate.

With continued reference to FIG. 4, it is seen that the bottom of the substrate holder 42 has a cylindrical stub shaft 54 depending downwardly from about its center point. A helical compression spring 56 is also carried in a circular hole 58 which extends a short way into the upstanding abutment member 52. The support 44 for the substrate holder 42 is also generally rectangular but has its longitudinal axis perpendicular to the longitudinal axis of the substrate holder 42. The support 44 is provided with a dovetailed channel 60 which receives a mating slide 62 having a vertically extending circular socket 64 in its upper surface for receiving the stub shaft 54. The slide 62 is abutted by a compression spring 66 attached to a dovetailed slide stop 68 and by an adjustment screw 70 at its opposite ends. The slide stop 68 may be held in position by means such as the screw 71 and a tapped hole in the channel 60. A pair of transverse upstanding walls, 72 and 74, are mounted at the opposite ends of the support 44. A rotational position adjustment screw 76 extends through the abutment wall 74 and a stub shaft 78 extends longitudinally from the outer end of the wall 72. A dovetailed slide bar 80 is integrally connected to the lower surface of the support 44.

The base plate 17 is provided with a longitudinally extending dovetailed channel 82 for receiving the slide 80 of the support 44. An upstanding partial end wall 84 on one end of the base plate 17 carries an adjustment screw 86 for aligning the substrate on the base plate 17. The platform 14 is integrally attached to the opposite end of the base plate 17 and has a pair of upstanding dowel pins 88 thereon for positioning the multiple nest loading tray 16 which carries mating through orifices for receiving the dowel pins 88. A helical compression spring 90 is attached to extend longitudinally from the side of the platform 14, as shown in FIG. 4, for fitting over the stub shaft 78.

The position of the substrate holder 42 and thus the substrate 12 can be accurately controlled on the base plate 17 by means of the adjustment screws 70, 76 and 86 as follows. The support 44 is mounted on the base 17 by inserting slide 80 into channel 82 and the holder 42 is mounted on the support 44 by fitting the shaft 54 into the socket 64 in slide 62, slide 62 being positioned within the channel 60. The longitudinal position of the substrate with respect to the base 17 is determined by adjusting screw 86 thereby causing the slide 80 of support 44 to slide in groove 82 against the biasing effect of the spring 90. The transverse position of the substrate can be fixed by adjusting the screw 70 causing the slide 62 and the holder 42 to move transversely against the bias of the spring 66. The rotational alignment of the substrate is accomplished by adjusting screw 76 causing the holder 42 to rotate clockwise against the counterclockwise bias of spring 56. Thus by the use of these three fine adjustment screws the position of the substrate relative to the base plate 17 and loading tray 16 can be accurately accomplished.

Referring to FIG. 3, the upper surface of the loading tray 16 is etched to form a series of nests or recesses 100, each of which is accurately positioned relative to the surface of the loading tray 16, and to the dowels 88, and adapted to receive a single circuit element to be transferred. The size and configuration of the recesses 100 is accurately controlled such that, when a circuit element is placed therein, its position relative to the loading tray 16 is accurately maintained. The relative position of the recesses 100 is precisely the orientation which the circuit elements are to occupy when placed on the substrate 12. Therefore, the substrate 12 can be completed by transferring each of the circuit elements from the individual recesses 100 to a location on the circuit substrate 12 occupying the same surface coordinates as the circuit element once occupied on the loading tray 16.

Again referring to FIG. 2 the platform 14 and base 17 are attached to an X–Y positioning mechanism which includes a support table 102 which is rigidly connected to a pair of cylindrical slide bars 104 which can slide along a fixed axis parallel to the longitudinal axis of the base plate 17 through bushings 106 in a block assembly 108. The block assembly 108 is slideably mounted on a pair of slide bars 110 which extend transversely of the base plate 17 so that the base plate 17 and the associated platform assemblies 10 and 14 can be moved in a transverse direction. Since the base plate 17 is rigid, the positional interrelationship of substrate 12 and the multiple nest loading tray 16 is at all times maintained.

Referring to FIGS. 1 and 2, the X–Y positioning mechanism includes a series of conventional rack and pinion gears such as racks 112, 114, 116 and 118, gears 120 and gear boxes 122 and 124. The rack and pinion linkage is driven by the indexing arm 22. The indexing template 24 is an exaggerated representation of the surface of the multiple nest loading tray 16 and shows the relative position of the recesses 100 by a series of positioning dots 126. The indexing arm 22 is manually movable along fixed axes determined by the slide bar pairs 126 and 128. Since the size of the indexing template 24 is enlarged to allow visual orientation by the operator, the gear ratio between the rack and pinions for the indexing arm and the rack and pinions for the support table 102 must be the same as the enlargement factor. This is accomplished by selecting the ratios in the respective gear boxes Therefore, when the indexing arm 22 is moved relative to the indexing template 24 on slide bars 126 and 128 respectively, the platform assemblies 10 and 14 are, in turn, moved on slide bars 104 and 110 respectively, but are moved a smaller distance in accordance with the enlargement factor of the template 24. When the operator wishes to transfer a given circuit element, he adjusts the indexing arm 22 by means of a knob 130 so that it is directly aligned with the proper mark 126 on the indexing template 24. This operation is advantageously accomplished by including a light source and reflector (not shown) on the indexing arm 22 to project a light beam onto the template 24, such that the operator need only align the light beam over a given mark 126. This, in turn, aligns the platform assemblies 10 and 14 beneath the transfer mechanism 18 so that the corresponding circuit element is aligned beneath the vacuum pickup needle 20. The alignment of the pickup needle 20 over the circuit element is not critical, since the accurate placement of the circuit element on the substrate 12 is dependent only on the interalignment of the loading tray 16 and the substrate 12, and the accurate movement of the transfer mechanism 18 between two fixed positions.

Referring now to FIGS. 5, 6 and 8 the operation of the transfer mechanism 18 can be explained. The transfer mechanism 18 has two stable positions, the first of which is shown in FIG. 5 and termed the "extended position;" and the second of which is shown in FIG. 6 and termed the "retracted position." In the extended position the vacuum pickup needle 20 is positioned adjacent the loading tray 16, while in the retracted position the needle 20 is positioned adjacent the circuit substrate 12. In the extended position the transfer mechanism 18, which is mounted on a pair of slides 132 which slide through a pair of bearing blocks 134, is maintained against an adjustable stock 136 (see FIG. 8) by a spring return pneumatic actuator 138. The pneumatic actuator is mounted on one of the bearing blocks 134, and has a piston rod 140 which passes through this bearing block 134 to engage a driving member 141 which is attached to the slides 132. Likewise, in the retracted position shown in FIG. 6, the transfer mechanism 18 is retracted by the spring bias in the pneumatic actuator 138 against a second adjustable stop 140 (see FIG. 8).

Referring to FIG. 8, the adjustable stops 136 and 140 are bolts which are threaded into the bearing blocks 134. These bolts engage opposite ends of the rod 142 of a free-runing piston 144 mounted in the driving member 141. This piston 144 circulates a fluid through an orifice 146, the size of which is defined by the position of a needle valve 148. The piston 144 will bottom out at either end of its cylinder 150 and will act as a shock absorber for the transfer mechanism 18 when the pneumatic actuator 138 drives the piston rod 142 against the adjustable stops 136 and 140.

The two positions defined by adjustable stops 136 and 140 are interrelated with the positions of the loading tray 16 and the substrate 12, such that the distance between a given location on the loading tray 16 and its associated position on the substrate 12 is identical to the distance which the transfer mechanism 18 moves between its adjustable stops 136 and 140.

The transfer mechanism 18 includes a pneumatic cylinder 156 for vertically reciprocating the vacuum pickup needle 20. This pneumatic cylinder is actuated by air pressure entering the transfer mechanism 18 through an inlet tube 158. A vacuum is drawn at the head of the vacuum needle 20 through a vacuum tube 160 (see FIG. 7). When the transfer mechanism 18 is in the extended position shown in FIG. 5, the vacuum needle 20 may be pneumatically extended by applying air pressure to the tube 158 to contact the surface of the loading tray 16 directly above a circuit element. By drawing a vacuum through the tube 160 and through the head of the vacuum needle 20, the circuit element may be temporarily attached to the head of the vacuum needle 20. The vacuum needle 20 may then be vertically returned into the transfer mechanism 18, to the position shown in FIG. 5, by relieving the air pressure in the tube 158. The transfer mechanism 18 may now be moved by the pneumatic actuator 138 to the retracted position shown in FIG. 6. The vacuum needle 20 is again pneumatically extended, this time contacting the surface of the substrate 12 at a position which is accurately located relative to the previous position of the circuit element on the loading tray 16. The vacuum which is drawn through the tube 160 is now released and the vacuum needle 20 is vertically returned into transfer mechanism 18 leaving the circuit element in place on the circuit substrate 12. This completes the transfer cycle of an individual circuit element. The apparatus may be pneumatically programmed to perform this transfer cycle automatically once the support table 102 has been properly positioned under the transfer mechanism 18 by the operator, or the various steps of the cycle can be pneumatically actuated upon command signals by the operator as with the start and complete buttons 38 and 40 of FIG. 1.

The operator may now shift the position of the table 102 shown in FIG. 1 by moving the indexing arm 22 over the indexing template 24 and therefore place the extended transfer mechanism 18, as shown in FIG. 5, above the new circuit element on the loading tray 16. This alignment in turn aligns the circuit substrate 12 so that it will be beneath the retracted transfer mechanism shown in FIG. 6, and therefore the transfer of another circuit element may be accomplished. The operator continues this operation, moving the circuit elements one at a time, until all of the circuit elements located in the loading tray 16 have been transferred to their related positions on substrate 12. Once all of the circuit elements are transferred, the operator replaces the loading tray 16 with a new preloaded tray and the circuit substrate 12 with a new empty substrate, and repeats the entire operation. There is no need for the operator to place a semiconductive chip in the loading tray nest after each pickup as with prior devices.

Another feature of the present invention, most clearly explained by reference to FIGS. 5 and 6, is the possibility of fixedly mounting a conventional adhesive applicator 168, and its associated adhesive needle 170 on the slide bars 132 which support the transfer mechanism 18. The distance between the vacuum needle 20 and the applicator needle 170 is controlled so that when the vacuum needle is above a circuit element on the loading tray 16, the adhesive applicator will be above the point on the substrate 12 which will receive the circuit element to be transferred. Since both the transfer mechanism 18 and the adhesive applicator 168 are fixed on the slide bars 132 this spacing is maintained throughout the transfer cycle shown in FIGS. 5 and 6.

When the vacuum pickup needle 20 is positioned in the extended position over a given location on the loading tray 16, as shown in FIG. 5, the adhesive needle 170 is accurately positioned over the location on the circuit substrate 12 to which the circuit element directly beneath the vacuum needle 20 is to be transferred. When the vacuum needle 20 is pneumatically vertically extended to contact the surface of the circuit element on the loading tray 16, the adhesive needle 170 may be pneumatically extended to contact the surface of the circuit substrate 12. Once extended, and during the time when the vacuum is being drawn on vacuum needle 20 to pick up the circuit element from the loading tray 16, the adhesive applicator 168 applies a metered amount of adhesive to the surface of the circuit substrate 12, and the needle 170 is then vertically returned into the adhesive applicator 168. When the transfer mechanism 18 is horizontally reciprocated to its retracted position shown in FIG. 6 the adhesive applicator 168 is reciprocated to a retracted position so that the transfer mechanism 18 may occupy the space above the circuit substrate 12.

In order to avoid damaging either the circuit elements or the circuit substrate 12 to which the circuit elements are transferred, it is advantageous to limit the amount of force which either the vacuum pickup needle 20 or the adhesive applicator needle 170 will exert on the circuit element and the circuit substrate 12. The force limiting devices which are used must be capable of limiting the force exerted on these elements within a given range regardless of the height of a given circuit element or a given substrate. That is, the force which either the transfer mechanism 18 or the adhesive applicator 168 exerts should remain fairly constant regardless of the thickness of a particular loading tray 16 or circuit substrate 12.

The means used to limit the force applied by the vacuum pickup needle 20 is best explained by reference to FIGS. 7 and 8. When air pressure is applied to the tube 158 it raises the pressure in the pneumatic cylinder 156 and presents a downward force to a bored piston 172. This piston 172 then moves downwardly against the force of a biasing spring 174 which returns the piston 172 to its elevated position whenever the air pressure in the air tube 158 is relieved. Downward motion of the piston 172 presents the downward force on the vacuum pickup needle 20 through a helical spring 176 which is disposed axially within the bore of the piston 172. This spring 176 is designed such that it will exert a limited downward force on the vacuum needle 20 which force remains fairly constant within a given range of compression of the spring 176. Therefore, when the vacuum pickup needle 20 contacts the surface of either the loading tray 16 or the circuit substrate 121, the downward force applied to the vacuum pickup needle 20 is limited to that force which the spring 176 will exert. The vacuum tube 160 is connected to the vacuum pickup needle 20 through an airtight fitting 178 (see FIGS. 2 and 7) which passes through a slot 180 in the side of the pneumatic cylinder 156. Engagement of the fitting 178 with the ends of this slot 180 in the pneumatic cylinder 156 therefore limits the total excursion in either direction of the vacuum pickup needle 20.

The means utilized to limit the force which the adhesive applicator needle 170 exerts upon the circuit substrate 12 is best described by reference to FIG. 8. The adhesive applicator 168 is maintained in a rest position as shown in FIG. 8 by the action of a counter weight 180 fixedly attached to a bar 181 which pivots about a pivot pin 182 and has its opposite end connected to the adhesive applicator 168 through a second pivot pin 184. To lower the adhesive applicator 168, a pneumatic rotary actuator 186, as shown in FIG. 2, rotates a pulley 188 through a predetermined arc, which in turn pulls on a length of cord 190 which extends over a directional pulley 192 and is attached to a weight 194 which previously was at rest on a base 195. When lifted by the cord 190, the weight 194 adds to the total weight of the adhesive applicator 168 and this combined weight is sufficient to overcome the force presented by the counter weight 180. When the adhesive applicator therefore lowers around the pivot point 182, the adhesive applicator needle 170 contacts the surface of the circuit substrate 12. In its extended position, the force which is exerted by this adhesive applicator needle 170 is limited by the combined weights of the weight 194 and the adhesive applicator 168 working against the counter weight 180. Therefore, within a limited range of travel of the adhesive applicator needle 170, which range is defined by the distance which the weight 194 can travel without contacting the surface 195 or a surface 196 of the adhesive applicator housing, the force which the adhesive applicator needle 170 applies is constant.

It should be noted that while an adhesive applicator has been shown and described as the means for permanently mounting the circuit elements upon the circuit substrate 12, there are a variety of methods which are currently used to attach different types of circuit elements to different types of circuit substrates. The methods most often used include ultrasonic bonding, thermal-compression bonding and soldering. The means for bonding circuit elements using any of these methods may be attached to the present device and located either in the position here described for the adhesive applicator 168 or attached as an added component upon the transfer mechanism 18.

The invention may be embodied in other specific forms without deparing from the spirit or essential characteristics thereof. The present embodiment is therefore to be considered in all respects as illustrative and not restrictive, the scope of the invention being indicated by the appended claims rather than by the foregoing description, and all changes which comes within the means and range of equivalency of the claims are therefore intended to be embraced therein. What is claimed and desired to be secured by Letters Patent is:

1. A transfer apparatus for accurately positioning a circuit element on a substrate comprising:

a transfer mechanism for selectively picking up and releasing said circuit element and for moving said circuit element between a first predetermined position and a second predetermined position; and means for simultaneously positioning in tandem said circuit element in said first predetermined position and a selected portion of said substrate in said second predetermined position.

2. A transfer apparatus as defined in claim 1 wherein said means for positioning comprises:
a moveable base plate; and
a pair of mounting members for receiving said circuit element and said substrate juxtaposed at opposite ends of said base plate, one of said members being integrally connected to said base plate and the other of said members having means thereon for accurately aligning said other member on said base plate at a fixed spaced position from said one member.

3. A transfer apparatus as defined in claim 2 wherein said means for positioning further comprises:
a support table subjacent said base plate and rigidly connected thereto;
means connected to said support table for defining a first fixed axis for reciprocal movement of said support table to locate one position parameter of the circuit element in said first predetermined position; and
means connected to said support table for defining a second axis for reciprocal movement of said support table, said second axis being perpendicular to said first axis for locating the second position parameter of the circuit element in said first position, thereby locating the X–Y parameters of the circuit element at said first position and the X–Y parameters of the portion of the substrate at said second position.

4. A transfer apparatus as defined in claim 3 wherein the circuit elements are maintained in a plurality of spaced recesses in a loading tray mounted on said one mounting member so that the X–Y parameters determine which of the circuit elements are in alignment with said transfer mechanism at said first position for transfer to said second position.

5. A transfer apparatus as defined in claim 3 wherein said means for positioning further comprises means for manually controlling the position of said support table along said first and second axes, including an indexing arm for moving to a selected position and gear means connected to said indexing arm and said support table for coordinating and reducing the movement of said support table in conjunction with the movement of said indexing arm.

6. A transfer apparatus as defined in claim 2 wherein said other of said mounting members comprises:
a holder for receiving a circuit substrate thereon;
a support member for mounting said holder thereon;
means on said support member for adjusting the rotational and transverse position of said holder on said support member;
means on said support member for mounting said support member in a longitudinal slot on said base plate; and
means on said base plate for adjusting the longitudinal position of said support member on said base plate.

7. A transfer apparatus as defined in claim 6 wherein said adjusting means each comprise threaded adjusting screws and springs mounted to bias the member being adjusted against the adjusting screws.

8. A transfer apparatus as defined in claim 1 wherein said transfer mechanism includes:
means for reciprocating said transfer mechanism along a fixed axis in a horizontal plane between two points above said first and second predetermined position; and
means for reciprocating said transfer mechanism along fixed axes in vertical planes from said points above said first and second positions into said first and second positions.

9. The transfer apparatus defined in claim 8 wherein said transfer mechanism further includes:
a vacuum pickup needle; and
means for limiting the force with which said vacuum pickup needle contacts said circuit element.

10. The transfer apparatus defined in claim 8 wherein said transfer mechanism further includes:
an adhesive applicator; and
means for limiting the force with which said adhesive applicator contacts said substrate.

11. The transfer apparatus defined in claim 10 wherein said adhesive applicator releases a metered quantity of adhesive on contact with said substrate.

12. The transfer appratus defined in claim 8 additionally comprising:
means for moving said transfer mechanism between two fixed locations;
stop members at said two fixed locations; and
means for absorbing the shock of said transfer mechanism upon contact with said stop members at said two fixed locations.

13. A transfer apparatus as defined in claim 8 wherein said transfer mechanism includes means for bonding said circuit element to said substrate mounted for movement with said transfer mechanism.

14. A transfer apparatus for accurately positioning an electric element on a substrate, comprising:
means for simultaneously aligning said electronic element in a first fixed position, and a predetermined portion of said substrate in a second fixed position; and
means for transferring said electronic element from said first fixed position to said second fixed position.

15. A transfer apparatus for accurately positioning a circuit element on a substrate, comprising:
a base,
means for movably mounting said substrate on said base;
a circuit element loading tray, adapted to position said circuit element, said loading tray being movably mounted on said base;
means for moving said substrate and said circuit element loading tray in tandem to a predetermined position;
a transfer mechanism movably mounted on said base;
means for moving said transfer mechanism between two predetermined positions relative to said means for mounting said substrate and said circuit element loading tray; and
means mounted on said transfer mechanism for transferring said circuit element from said circuit element loading tray to said substrate.

16. A transfer apparatus for accurately positioning a plurality of circuit elements on a substrate, comprising:
a base;
means for movably mounting said substrate on said base for motion within a first plane;
a circuit element loading tray adapted to position a plurality of circuit elements in a given spaced relationship to each other, said loading tray being movably mounted on said base for motion within said first plane;
means for moving said substrate and said circuit element loading tray in tandem to a predetermined position in said first plane;
a transfer mechanism movably mounted on said base;
means for moving said transfer mechanism between two predetermined positions relative to said substrate and said circuit element loading tray, one of said predetermined positions being over said substrate and the other of said predetermined positions being over said loading tray;
means mounted on said transfer mechanism for transferring one of said plurality of circuit elements from said circuit element loading tray to said substrate.

17. A transfer apparatus for accurately positioning a plurality of circuit elements on a substrate, comprising:
a base;
a substrate holder mounted on said base for motion in a first plane;

means for mounting said substrate on said substrate holder;

a mounting platform, mounted on said base for motion in said first plane;

a circuit element loading tray, adapted to restrain said plurality of circuit elements in a given spaced relationship to each other and having a predetermined spaced relationship with said mounting platform;

means for mounting said circuit element loading tray on said mounting platform;

means for moving said substrate holder and said mounting platform simultaneously to a predetermined position in said first plane;

a transfer mechanism mounted on said base for linear motion within a second plane, parallel to said first plane, between a first position opposite said mounting platform and a second position opposite said substrate holder; and means mounted on said transfer mechanism for removing one of said plurality of circuit elements from said circuit element loading tray when said transfer mechanism is in said first position for positioning said one of said plurality of circuit elements on said substrate when said transfer mechanism is in said second position.

18. A transfer apparatus for accurately positioning a plurality of circuit elements on a substrate, comprising:

a base;

a substrate holder and mounting platform moveable in tandem on said base;

means for accurately positioning said substrate holder and mounting platform in tandem relative to said base, comprising:

an indexing template mounted on said base; and an indexing arm, moveably mounted on said base, adjacent said indexing template, and connected to said means for accurately positioning such that the indexing arm's space relationship relative to said template bears a fixed relationship with the position of said substrate holder and mounting platform relative to said base;

means for accurately mounting said substrate on said substrate holder;

a circuit element loading tray adapted to accurately maintain said plurality of circuit elements on one of its surfaces;

means for accurately mounting said circuit element loading tray on said mounting platform; and a transfer and attachment mechanism comprising:

a rod, slideably mounted on said base so that it is moveable between two fixed locations adjacent said substrate holder and said mounting platform; and a vacuum pickup device, mounted on said rod, adapted to selectively pick up and release said circuit elements.

19. The transfer apparatus defined in claim 18 wherein said means for accurately mounting said circuit element loading tray on said mounting platform includes a pair of dowels which project from said mounting platform, said dowels removeably engaged matching orifices in said circuit element loading tray.

20. The transfer apparatus defined in claim 18 additionally including:

means for limiting the force with which said vacuum pickup device contacts said circuit elements.

21. The transfer apparatus defined in claim 20 wherein said means for limiting the force includes:

a bored, pneumatic actuated piston;

a spring, axially positioned within the bore of said piston, one end of said spring engaging the end of said bore; and a vacuum needle moveably mounted within said bore, engaging the other end of said spring, whereby the force applied by said needle on said circuit element is limited by the compression characteristics of said spring.

22. A transfer apparatus as defined in claim 18 wherein said transfer mechanism further includes an adhesive applicator mounted on said rod in spaced relationship with said vacuum pickup device, said spaced relationship being equal to the distance between said two fixed locations so that said applicator applies adhesive to said substrate at the point where said circuit element will be deposited by said vacuum pickup device.

23. The transfer apparatus defined in claim 22 additionally including:

means for limiting the force with which said adhesive applicator contacts are substrate.

24. The transfer apparatus defined in claim 23 wherein said means for limiting the force includes:

a counterweight connected to raise said adhesive applicator; and means for selectively adding a predetermined weight to said adhesive applicator, whereby said adhesive applicator may be selectively lowered against the action of said counterweight and said force is limited by the interaction of said weight and counterweight.

25. A method for positioning a circuit element on a substrate, comprising:

positioning said circuit element on a circuit element loading tray;

positioning said circuit element loading tray and said substrate, in tandem, adjacent a transfer mechanism which is moveable between two predetermined positions; and transferring said circuit element with said transfer mechanism from said circuit element loading tray to said substrate.

26. A method for positioning a plurality of circuit elements on a substrate, comprising:

positioning said plurality of circuit elements such that one of said plurality of circuit elements is in a predetermined location;

positioning said substrate such that the portion of said substrate on which said one of said plurality of circuit elements is to be positioned has a given space relationship with said predetermined location; and transferring said one of said plurality of circuit elements from said predetermined location to said portion of said substrate.

References Cited

UNITED STATES PATENTS

| | | | |
|---|---|---|---|
| 3,337,941 | 8/1967 | Drop | 29—208 X |
| 3,453,714 | 7/1969 | Clark et al. | 29—203 |
| 3,475,805 | 11/1969 | Rottmann | 29—203 |

THOMAS H. EAGER, Primary Examiner

U.S. Cl. X.R.

29—203 B, 203 P

PO-1050
(5/69)

UNITED STATES PATENT OFFICE
CERTIFICATE OF CORRECTION

Patent No. 3,611,561 Dated 10-12-71

Inventor(s) Paul A. Dosier

It is certified that error appears in the above-identified patent and that said Letters Patent are hereby corrected as shown below:

Col. 1, line 47, change "of" to --or--;
Col. 6, line 22, change "free-runing" to --free-running--;
Col. 8, line 6, change "121" to --12--;
Col. 8, line 57, change "deparing" to --departing--;
Col. 10, line 22, change "electric" to --electronic--;
Col. 12, line 23, change "are" to --said--;

Signed and sealed this 21st day of March 1972.

(SEAL)
Attest:

EDWARD M.FLETCHER,JR.
Attesting Officer

ROBERT GOTTSCHALK
Commissioner of Patents